United States Patent
Pflughaupt et al.

(10) Patent No.: US 7,335,995 B2
(45) Date of Patent: Feb. 26, 2008

(54) MICROELECTRONIC ASSEMBLY HAVING ARRAY INCLUDING PASSIVE ELEMENTS AND INTERCONNECTS

(75) Inventors: L. Elliott Pflughaupt, Los Gatos, CA (US); David Gibson, Lake Oswego, OR (US); Young-Gon Kim, Cupertino, CA (US); Craig S. Mitchell, San Jose, CA (US); Wael Zohni, San Jose, CA (US); Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 256 days.

(21) Appl. No.: 11/062,413

(22) Filed: Feb. 22, 2005

(65) Prior Publication Data
US 2005/0173796 A1   Aug. 11, 2005

Related U.S. Application Data

(63) Continuation-in-part of application No. 10/454,029, filed on Jun. 4, 2003, now Pat. No. 6,977,440, which is a continuation-in-part of application No. 10/267,450, filed on Oct. 9, 2002, now Pat. No. 6,897,565.

(60) Provisional application No. 60/328,038, filed on Oct. 9, 2001.

(51) Int. Cl.
*H01L 23/48* (2006.01)
(52) U.S. Cl. ............ 257/779; 257/778; 257/777; 257/E21.504; 257/E23.006
(58) Field of Classification Search ........ 257/777–779; 438/108, 612–614
See application file for complete search history.

(56) References Cited

U.S. PATENT DOCUMENTS

| 3,390,308 A | 6/1968 | Marley |
| 3,614,832 A | 10/1971 | Chance et al. |
| 3,683,105 A | 8/1972 | Shamash et al. |
| 3,832,769 A | 9/1974 | Olyphant, Jr. et al. |

(Continued)

FOREIGN PATENT DOCUMENTS

EP           072673         8/1982

(Continued)

OTHER PUBLICATIONS

"Megabyte Per Cubic Inch," Defense Science, May 1988, p. 56.

(Continued)

*Primary Examiner*—Dung A. Le
(74) *Attorney, Agent, or Firm*—Lerner, David, Littenberg, Krumholz & Mentlik, LLP

(57) ABSTRACT

A microelectronic assembly and a fabrication method are provided which includes a microelectronic element such as a chip or element of a package. A plurality of surface-mountable contacts are arranged in an array exposed at a major surface of the microelectronic element. One or more passive elements, e.g., a resistor, inductor, capacitor, or combination of the same are mounted to the microelectronic element, with an inner terminal of the passive element conductively mounted to an exposed surface of one contact and an outer terminal displaced vertically from the major surface of the microelectronic element.

17 Claims, 6 Drawing Sheets

U.S. PATENT DOCUMENTS

| | | |
|---|---|---|
| 3,868,724 A | 2/1975 | Perrino |
| 3,923,359 A | 12/1975 | Newsam |
| 4,216,577 A | 8/1980 | Badet et al. |
| 4,371,744 A | 2/1983 | Badet et al. |
| 4,371,912 A | 2/1983 | Guzik |
| 4,489,364 A | 12/1984 | Chance et al. |
| 4,540,226 A | 9/1985 | Thompson et al. |
| 4,551,746 A | 11/1985 | Gilbert et al. |
| 4,558,397 A | 12/1985 | Olsson |
| 4,627,151 A | 12/1986 | Mulholland et al. |
| 4,628,406 A | 12/1986 | Smith et al. |
| 4,638,348 A | 1/1987 | Brown et al. |
| 4,681,654 A | 7/1987 | Clementi et al. |
| 4,685,998 A | 8/1987 | Quinn et al. |
| 4,701,999 A | 10/1987 | Palmer |
| 4,710,798 A | 12/1987 | Marcantonio |
| 4,734,825 A | 3/1988 | Peterson |
| 4,746,392 A | 5/1988 | Hoppe |
| 4,754,316 A | 6/1988 | Reid |
| 4,761,681 A | 8/1988 | Reid |
| 4,772,936 A | 9/1988 | Reding et al. |
| 4,812,421 A | 3/1989 | Jung et al. |
| 4,823,234 A | 4/1989 | Honishi et al. |
| 4,829,666 A | 5/1989 | Haghiri-Tehrani et al. |
| 4,837,184 A | 6/1989 | Lin et al. |
| 4,841,355 A | 6/1989 | Parks |
| 4,855,867 A | 8/1989 | Gazdik et al. |
| 4,855,868 A | 8/1989 | Harding |
| 4,868,712 A | 9/1989 | Woodman |
| 4,878,098 A | 10/1989 | Saito et al. |
| 4,893,172 A | 1/1990 | Matsumoto et al. |
| 4,897,534 A | 1/1990 | Haghiri-Tehrani et al. |
| 4,897,918 A | 2/1990 | Osaka et al. |
| 4,918,811 A | 4/1990 | Eichelberger et al. |
| 4,937,203 A | 6/1990 | Eichelberger et al. |
| 4,956,694 A | 9/1990 | Eide |
| 4,967,261 A | 10/1990 | Niki et al. |
| 4,982,265 A | 1/1991 | Watanabe et al. |
| 4,994,902 A | 2/1991 | Okahashi et al. |
| 4,996,583 A | 2/1991 | Hatada |
| 4,996,587 A | 2/1991 | Hinrichsmeyer et al. |
| 4,999,319 A | 3/1991 | Hamano et al. |
| 5,028,986 A | 7/1991 | Sugano et al. |
| 5,029,325 A | 7/1991 | Higgins, III et al. |
| 5,037,779 A | 8/1991 | Whalley et al. |
| 5,045,921 A | 9/1991 | Lin et al. |
| 5,055,913 A | 10/1991 | Haghiri-Tehrani |
| 5,117,282 A | 5/1992 | Salatino |
| 5,127,570 A | 7/1992 | Steitz et al. |
| 5,128,831 A | 7/1992 | Fox, III et al. |
| 5,138,438 A | 8/1992 | Masayuki et al. |
| 5,148,265 A | 9/1992 | Khandros et al. |
| 5,148,266 A | 9/1992 | Khandros et al. |
| 5,172,303 A | 12/1992 | Bernardoni et al. |
| 5,198,888 A | 3/1993 | Sugano et al. |
| 5,222,014 A | 6/1993 | Lin |
| 5,247,423 A | 9/1993 | Lin et al. |
| 5,258,330 A | 11/1993 | Khandros et al. |
| 5,266,912 A | 11/1993 | Kledzik |
| 5,281,852 A | 1/1994 | Normington |
| 5,289,346 A | 2/1994 | Carey et al. |
| 5,304,252 A | 4/1994 | Condra et al. |
| 5,304,512 A | 4/1994 | Arai et al. |
| 5,311,401 A | 5/1994 | Gates, Jr. et al. |
| 5,313,096 A | 5/1994 | Eide |
| 5,334,875 A | 8/1994 | Sugano et al. |
| 5,337,077 A | 8/1994 | Browne |
| 5,346,861 A | 9/1994 | Khandros et al. |
| 5,350,947 A | 9/1994 | Takekawa et al. |
| 5,376,825 A | 12/1994 | Tukamoto et al. |
| 5,379,191 A | 1/1995 | Carey et al. |
| 5,384,689 A | 1/1995 | Shen |
| 5,390,844 A | 2/1995 | Distefano et al. |
| 5,394,009 A | 2/1995 | Loo |
| 5,397,916 A | 3/1995 | Normington |
| 5,397,921 A | 3/1995 | Karnezos |
| 5,409,865 A | 4/1995 | Karnezos |
| 5,412,247 A | 5/1995 | Martin |
| 5,455,740 A | 10/1995 | Burns |
| 5,479,318 A | 12/1995 | Burns |
| 5,489,749 A | 2/1996 | DiStefano et al. |
| 5,543,664 A | 8/1996 | Burns |
| 5,548,091 A | 8/1996 | DiStefano et al. |
| 5,552,631 A | 9/1996 | McCormick |
| 5,552,963 A | 9/1996 | Burns |
| 5,564,181 A | 10/1996 | Dineen et al. |
| 5,600,541 A | 2/1997 | Bone et al. |
| 5,608,265 A | 3/1997 | Kitano et al. |
| 5,616,958 A | 4/1997 | Laine et al. |
| 5,625,221 A | 4/1997 | Kim et al. |
| 5,637,536 A | 6/1997 | Val |
| 5,639,695 A | 6/1997 | Jones et al. |
| 5,642,261 A | 6/1997 | Bond et al. |
| 5,656,856 A | 8/1997 | Kweon |
| 5,659,952 A | 8/1997 | Kovac et al. |
| 5,663,106 A | 9/1997 | Karavakis et al. |
| 5,668,405 A | 9/1997 | Yamashita |
| 5,677,566 A | 10/1997 | King et al. |
| 5,681,777 A | 10/1997 | Lynch et al. |
| 5,701,031 A | 12/1997 | Oguchi et al. |
| 5,734,555 A | 3/1998 | McMahon |
| 5,751,063 A | 5/1998 | Baba |
| 5,783,870 A | 7/1998 | Mostafazadeh et al. |
| 5,784,264 A | 7/1998 | Tanioka |
| 5,801,439 A | 9/1998 | Fujisawa et al. |
| 5,804,874 A | 9/1998 | An et al. |
| 5,834,339 A | 11/1998 | Distefano et al. |
| 5,835,988 A | 11/1998 | Ishii |
| 5,844,315 A | 12/1998 | Melton et al. |
| 5,861,666 A | 1/1999 | Bellaar |
| 5,883,426 A | 3/1999 | Tokuno et al. |
| 5,912,507 A * | 6/1999 | Dunn et al. ................. 257/767 |
| 6,030,856 A | 2/2000 | DiStefano et al. |
| 6,072,233 A | 6/2000 | Corisis et al. |
| 6,093,029 A | 7/2000 | Kwon et al. |
| 6,108,212 A * | 8/2000 | Lach et al. ................. 361/768 |
| 6,180,881 B1 | 1/2001 | Isaak |
| 6,195,268 B1 | 2/2001 | Eide |
| 6,218,848 B1 | 4/2001 | Hembree et al. |
| 6,232,152 B1 | 5/2001 | DiStefano et al. |
| 6,268,649 B1 | 7/2001 | Corisis et al. |
| 6,272,744 B1 | 8/2001 | DiStefano et al. |
| 6,291,259 B1 | 9/2001 | Chun |
| 6,303,997 B1 | 10/2001 | Lee |
| 6,313,522 B1 | 11/2001 | Akram et al. |
| 6,335,565 B1 | 1/2002 | Miyamoto et al. |
| 6,342,728 B2 | 1/2002 | Miyazaki et al. |
| 6,369,445 B1 | 4/2002 | Khoury |
| 6,388,264 B1 | 5/2002 | Pace |
| 6,462,421 B1 | 10/2002 | Hsu et al. |
| 6,496,026 B1 | 12/2002 | Long et al. |
| 6,515,870 B1 | 2/2003 | Skinner et al. |
| 6,555,918 B2 | 4/2003 | Masuda et al. |
| 6,740,981 B2 | 5/2004 | Hosomi |
| 2002/0074669 A1 | 6/2002 | Watanabe et al. |
| 2003/0111709 A1 | 6/2003 | Lin et al. |
| 2003/0218235 A1 | 11/2003 | Searls et al. |
| 2004/0018693 A1 | 1/2004 | Shioga et al. |
| 2004/0031972 A1 | 2/2004 | Pflughaupt et al. |
| 2004/0257780 A1* | 12/2004 | Hester et al. ................. 361/782 |

FOREIGN PATENT DOCUMENTS

| | | |
|---|---|---|
| JP | 52-075981 | 6/1977 |

| | | |
|---|---|---|
| JP | 56-061151 | 5/1981 |
| JP | 57-31166 A1 | 2/1982 |
| JP | 58-178529 | 10/1983 |
| JP | 60-194548 | 3/1984 |
| JP | 61-029140 | 2/1986 |
| JP | 61-101067 | 5/1986 |
| JP | 61-120454 | 6/1986 |
| JP | 61-137335 | 6/1986 |
| JP | 61-255046 | 11/1986 |
| JP | 63-018654 | 1/1988 |
| JP | 63-311732 A | 12/1988 |
| JP | 62-226307 | 3/1989 |
| JP | 64-71162 | 3/1989 |
| JP | 60-77446 | 10/1989 |
| JP | 2-220468 | 9/1990 |
| WO | WO-89-10005 | 10/1989 |
| WO | WO-89-12911 | 12/1989 |
| WO | WO-94-03036 | 2/1994 |
| WO | WO-03/019654 | 3/2003 |

OTHER PUBLICATIONS

"Three-Dimensional Packaging," Defense Science, May 1988, p. 65.
Bang, U.S. Appl. No. 10/656,534, filed Sep. 5, 2003.
Forthun, U.S. Appl. No. 07/552,578, filed Jul. 13, 1990.
IBM Technical Disclosure Bulletin, Jan. 1985, vol. 27, No. 8, p. 4855.
Mohammed, Serial No. PCT/US02/26805, filed Aug. 22, 2002.
Newsam, U.S. Appl. No. 60/314,042, filed Aug. 22, 2001.
Official Action mailed Jun. 24, 2004, in U.S. Appl. No. 10/430,986.
Press Release and attachments, International Microelectronic Component Industries, Oct. 1, 1994.
Tummala, Rao R. and Eugene J. Rymaszewski, "Microelectronic Packaging Handbook," 1989, pp. 420-423.

* cited by examiner

MICROELECTRONIC ASSEMBLY HAVING ARRAY INCLUDING PASSIVE ELEMENTS AND INTERCONNECTS

CROSS-REFERENCE TO RELATED APPLICATIONS

This application is a continuation-in-part of U.S. patent application Ser. No. 10/454,029 filed Jun. 4, 2003 now U.S. Pat. No. 6,977,440. Said application is a continuation-in-part of U.S. patent application Ser. No. 10/267,450, filed Oct. 9, 2002, now U.S. Pat. No. 6,897,565, which in turn claims benefit of U.S. Provisional Patent Application Ser. No. 60/328,038 filed Oct. 9, 2001. The disclosures of all the afore-mentioned applications are hereby incorporated by reference herein.

BACKGROUND OF THE INVENTION

The present application relates to microelectronic assemblies and, in particular, to packages incorporating passive elements, especially discrete resistive and/or capacitive elements, as well as to stacked packages, and to components and methods useful in making such assemblies.

Many types of semiconductor chips contain integrated circuits which require passive elements, e.g., discrete resistive, capacitive and/or inductive devices to be mounted in close proximity to input/output pads of the chip and other pads, for purposes such as impedance matching, i.e., termination of a transmission line, DC (direct current) blocking, decoupling, or other purposes. This is especially true of integrated circuits for memory devices, and communication devices, e.g., especially high-speed serial communication interfaces and radio communication devices.

While passive elements can sometimes be incorporated within semiconductor chips, they are usually limited to very small value devices, due to the relatively large amounts of the chip device area that they tend to occupy. Larger value devices can only be provided external to the chip. Therefore, in the aforementioned memory and communication devices, many of the required passive devices must be provided off of the chip. Indeed, some chips require hundreds of such passive elements per package.

The need for external passive elements poses difficulties to the design and fabrication of a microelectronic assembly such as the chip package and higher order assemblies. A large number of passive elements is difficult to incorporate onto a circuit panel to be mounted to the package. It also becomes very difficult to route wiring traces on a circuit board between all of the required passive elements and the signal I/O of the chip. In addition, superior performance can sometimes be achieved when the passive element and the I/O pad of the chip are disposed in close proximity. Accordingly, it would be desirable to provide a way of mounting passive elements in a package which addresses these and other concerns.

SUMMARY OF THE INVENTION

According to one aspect of the invention, a microelectronic assembly is provided which includes a microelectronic element such as a chip or element of a package. A plurality of surface-mountable contacts are arranged in an array exposed at a major surface of the microelectronic element. One or more passive elements, e.g., a resistor, inductor, capacitor, or combination of the same are mounted to the microelectronic element, with an inner terminal of the passive element conductively mounted to an exposed surface of one contact and an outer terminal displaced vertically from the major surface of the microelectronic element.

In a preferred embodiment of the invention, the microelectronic assembly is bonded to a further microelectronic element, e.g., another chip, package element, or circuit panel, which faces the first microelectronic element, with the passive elements being disposed in series between contacts of the first and second microelectronic elements.

In a method of fabricating a microelectronic assembly, passive elements are mounted in series between a contact of one microelectronic element, e.g., a package element, and a contact of another microelectronic element such as a circuit panel. Various joining techniques can be used, such as hierarchical joining, in which an attach temperature of a bonding medium used to bond the passive elements to the first microelectronic element is higher than an attach temperature of a bonding medium used to make soldered connections between the two microelectronic elements. In a particular embodiment, passive elements are arranged at desired locations maintained within a sheet-like or tape-like dielectric element and the dielectric element is aligned and held in place to a microelectronic element such as a chip or package element. Solder balls can then be provided into openings in the dielectric element, and the assembly is then heated to join the passive elements to the microelectronic element and to form conductive bumps at locations of the solder balls. Depending upon the material used to form the dielectric element, it can either be left in place in the microelectronic assembly, or be removed, such as by etching performed selective to the material at the surface of the microelectronic element.

DETAILED DESCRIPTION

In accordance with embodiments of the invention described herein, a microelectronic assembly is provided in which a microelectronic element, e.g., a chip or element of a package has a plurality of contacts exposed at a major surface. In one embodiment, the microelectronic element is a chip, in which the contacts are bond pads of the chip. Some of the bond pads of the chip are bonded by a conductive medium, e.g., a solder, to contacts of a package element such as a chip carrier or substrate, for example. Others of the bond pads have series connections through passive elements, especially resistive and/or capacitive elements to the contacts of the package element. In such way, small passive elements, e.g., discrete passives can be located in very close proximity to individual input/output ("IO") pads of the chip, such as for impedance matching purposes, among others. By mounting passive elements to contacts within the interfacial spacing between a circuit panel and a package, or between a package element and a chip, the aforementioned problems of mounting passive elements on an external surface of a circuit panel can be avoided.

Moreover, such placement of the passive elements within an array of contacts reclaims area on the circuit panel that would otherwise be taken up by passive elements outside the array area, as well as the area required for wiring to and from the passive elements.

In a particular embodiment, a microelectronic assembly or package includes a chip having a plurality of bond pads arranged in an array at a major surface of the chip. A package element has a corresponding array of contacts arranged at a surface opposing the major surface of the chip. Some of the bond pads of the array of the chip are bonded to the contacts of the package element via solder bumps. Discrete passive elements, being, in one embodiment, either individual discrete resistors, individual discrete capacitors, or both, are mounted to others of the bond pads, the discrete passive elements having inner terminals conductively mounted to the bond pads. The discrete passive elements also have outer terminals which are insulated from the inner terminals, such that as mounted, the outer terminals are displaced, e.g., in a vertical direction, from the major surface of the chip. The inner and outer terminals are connected to each other through one or more passive components, e.g., a resistor and/or a capacitor. For example, when the passive element includes a discrete capacitor, one plate of the discrete capacitor can be conductively connected to the inner terminal while the other plate of the discrete capacitor is connected to the outer terminal. The outer terminals, in turn, are mounted to ones of a corresponding array of contacts exposed at the surface of the package element. In such way, series connections are provided through the discrete passive elements between the chip and the package element.

Figure 1:
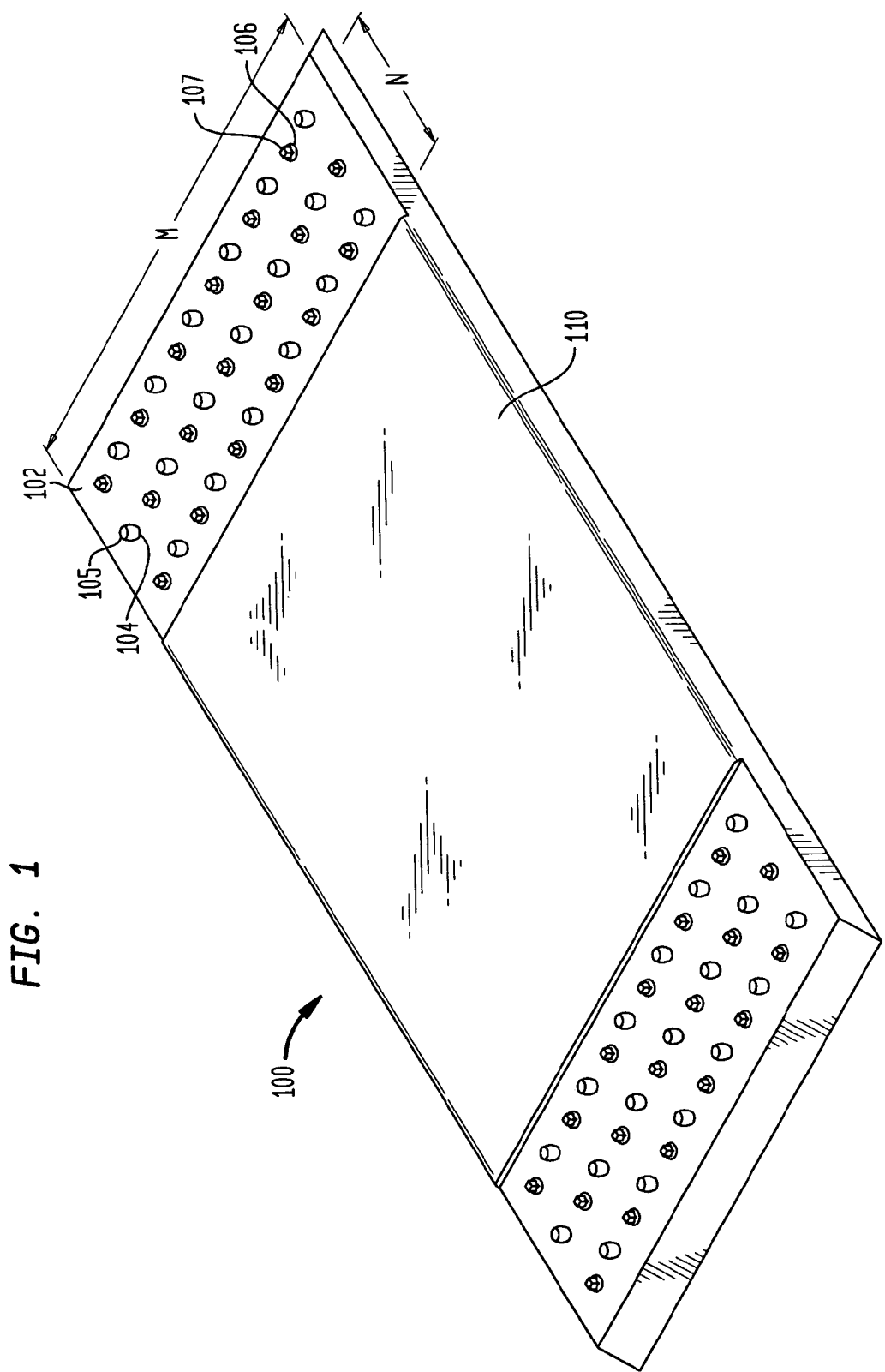
FIG. 1 is a perspective view of a microelectronic assembly in accordance with one embodiment of the invention.
Figure 2:
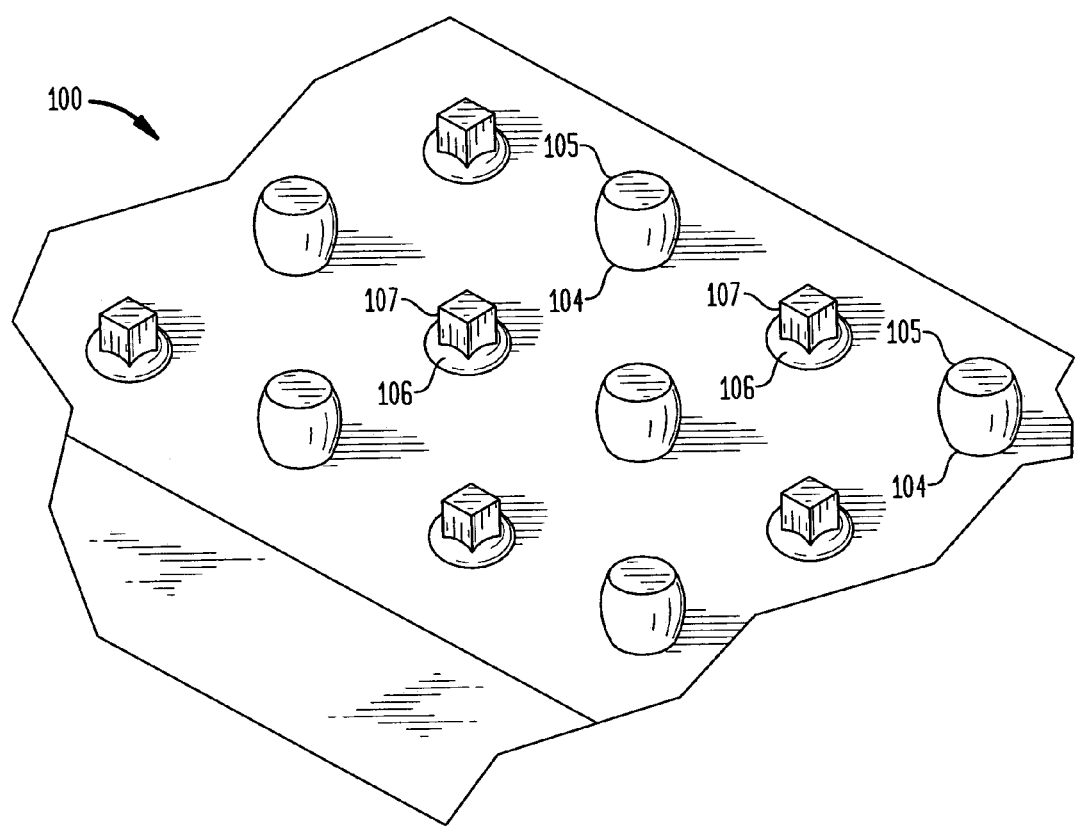
FIG. 2 is an enlarged partial, perspective view of the microelectronic assembly in accordance with the embodiment of the invention illustrated in FIG. 1.

FIG. 1 is a perspective view of a microelectronic element viewed toward a contact-bearing surface 102 on which a plurality of contacts 104, 106 are provided, e.g., as arranged in an array. FIG. 2 is an enlarged view of the same microelectronic element 100, showing individual contacts 104, 106 of the microelectronic element 100 in greater detail.

In one embodiment, the microelectronic element 100 shown in FIG. 1 can be a semiconductor chip on which active devices and/or circuits 110 are provided. In another embodiment, described below, the microelectronic element is a package element, e.g., chip carrier, which may be part of a packaged chip. In the example shown in FIG. 1, the contacts, i.e., the bond pads of the chip, are arranged in an M by N array having a number M of the contacts aligned in a first lateral direction extending along the surface 102 of the chip and a number N of contacts aligned in a second lateral direction extending along the surface 102 of the chip 100. The numbers M and N can each be equal to or greater than one, and can vary independently from one another. In the example shown in FIG. 1, the number "M" of contacts disposed in a direction of the width of the chip is nine, and the number "N" of contacts disposed in a direction of the length of the chip is three.

In another example (not shown), the contacts can be disposed as a single row of contacts. Stated another way, in one such example, the contacts are disposed in a single row extending in a direction of the width of the chip, e.g., the array measures M=5 (five) contacts in a widthwise direction, and N=1 (one) contact in the lengthwise direction. In yet another example, the contacts can be disposed as a single row of contacts in the direction of the length of the chip, e.g., the array measures M=1 (one) contact in the widthwise direction, and N=10 (ten) contacts in the lengthwise direction.

In one preferred embodiment, the contacts of the array are provided at a fine or relatively fine pitch, e.g., having a pitch of a few mils (thousandths of one inch), up to a few tens of mils between centers of adjacent ones of the contacts. Measurements provided in standard units are illustrative, and not limiting, as the size of such features are the same whether stated in standard or metric units. Discrete passive elements are available having dimensions comparable to solder balls considered to be medium-sized at this time. Specifically, some discrete passive elements can be made which have rectilinear box-shape, have dimensions of 0.6 mm×0.3 mm×0.3 mm. These dimensions translate to approximately 24 mils×12 mils×12 mils. These dimensions are such that, as mounted in a package between two microelectronic elements, e.g., between a chip and a chip carrier, the passive element occupies a volume which is not substantially greater than a volume occupied by a conductive bump, e.g., solder bump disposed on a contact of the microelectronic element. In addition, preferably, a height of the passive element is not greater than a height of conductive bumps of the package.

Preferably, the contacts of the array are disposed at a uniform pitch in each direction of the array. However, in a particular embodiment, the contacts can be arranged to have different pitches in the different lateral directions in which the contacts are aligned within the array. Illustratively, given passive elements having dimensions of 0.3 mm in each lateral direction parallel to the major surface of a chip, and a vertical dimension of 0.6 mm, the pitch between adjacent contacts of the array can be uniform in both lateral directions (length, width along the surface) at 0.8 mm pitch or perhaps 1.0 mm pitch in both lateral directions. Alternatively, and by way of illustration, the pitch could be 0.8 mm in one lateral direction and be a different pitch, such as 1.2 mm or 2.0 mm or other measurement in the other lateral direction.

Figure 3:
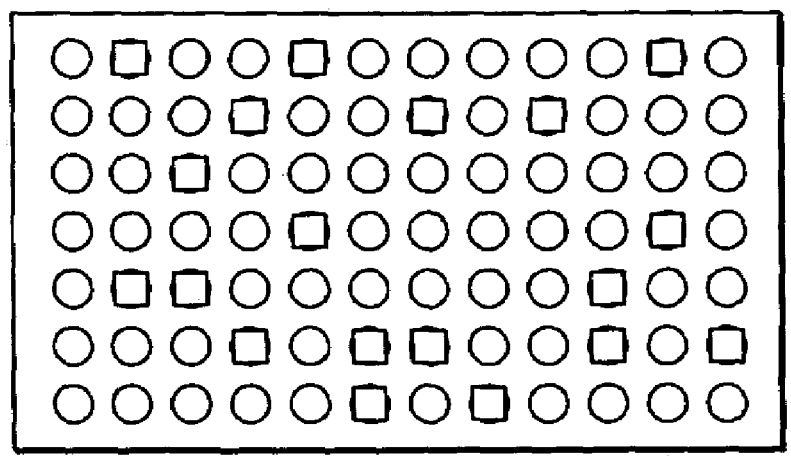
FIG. 3 is a top (plan) view of the microelectronic assembly in accordance with the embodiment illustrated in FIG. 1.

In the particular embodiment shown in FIG. 1 and as best shown in FIG. 2, the contacts of the array, i.e., the bond pads 104, 106 of the chip, are disposed at a uniform pitch, i.e., being the same pitch in each of the two orthogonal directions (width and length) of the chip, and the numbers M and N of bond pads that are aligned in each of the width and length directions are each greater than one. Passive elements 107, e.g., elements incorporating passive components such as resistors, capacitors or inductors, are bonded to some bond pads 106 of the array of bond pads through a fusible conductive medium such as a solder, tin, or eutectic composition, for example. Solder bumps 105 are bonded to other bond pads 104 of the chip. As shown in FIGS. 1-2, the passive elements are disposed at alternating locations in a checkerboard pattern throughout the M by N array of contacts, such that the solder balls occupy some locations of the array, and passive elements occupy every location. In a variation of such arrangement, as shown in FIG. 3, passive elements are disposed at locations within the array determined according to particular requirements of the chip, and hence, do not exhibit a pattern which is regular and uniform to the eye.

Figure 4:
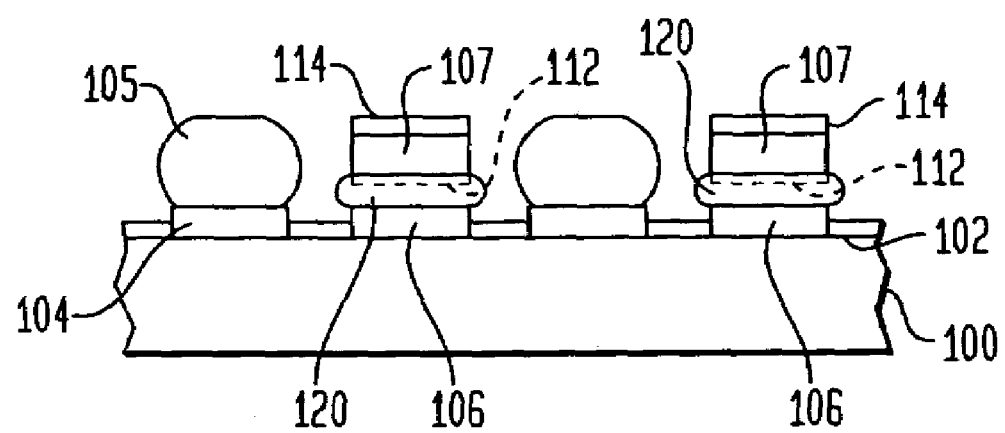
FIG. 4 is a partial elevational view of the microelectronic assembly in accordance with the embodiment illustrated in FIG. 1.

As further shown in FIG. 4, the passive elements include inner terminals 112 and outer terminals 114, in form of conductive, e.g., metallic end caps which are insulated from each other. The inner terminals 112 provide conductive connection to the chip 100 through bond pads 106, and outer terminals 114 are available to provide conductive connection to another microelectronic element, such as a package element. A bonding medium 120, preferably, a fusible conductive medium such as a solder, bonds the inner terminals to the bond pads 106. In the arrangement shown in FIG. 4, such bonding medium 120 can be referred to as an inner conductive bump.

Solder bumps 105, disposed at other bond pads 104 of the array of contacts, facilitate the formation of conductive interconnects between the chip 100 and a package element 200 (FIG. 5) to be mounted to the chip 100. As such, the chip is suitable for mounting to the package element using a flip-chip mounting technique. In the flip-chip mounting technique as illustrated in FIG. 6, a chip 100 is placed with the contact-bearing surface 102 facing a corresponding mounting surface of the package element 200, e.g., chip carrier or substrate, and bond pads 104 of the chip are bonded to corresponding contacts 204 of the package element 200 via solder bumps 105. In addition, the passive elements 107 are mounted between the bond pads 106 of the chip and corresponding contacts 206 of the package element. As shown in FIG. 6, the passive elements may be conductively connected to the chip and the package element through masses of solder or other conductive bonding medium referred to herein as inner conductive bumps 120 and outer conductive bumps 122, respectively.

Figure 5:
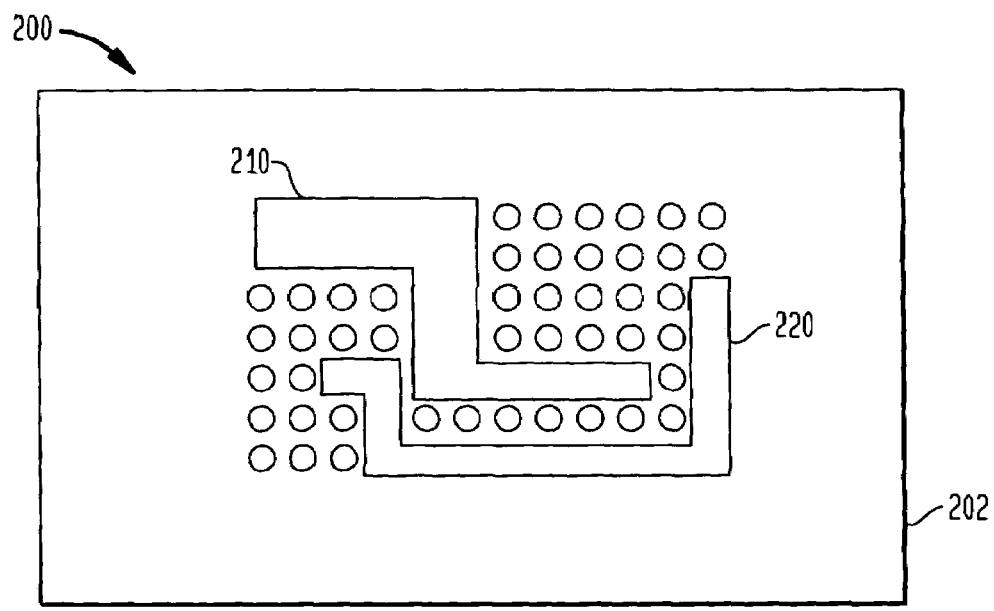
FIG. 5 is a top (plan) view of an element of a microelectronic assembly in accordance with another embodiment of the invention.
Figure 6:
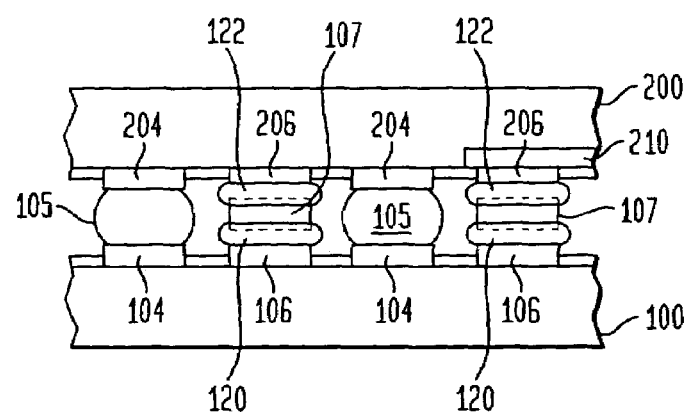
FIG. 6 is an elevational view of a microelectronic assembly in accordance with one embodiment of the invention.

As shown in FIG. 5, such microelectronic element 200 may include conductive patterns, e.g., conductive planes 210, 220 which extend laterally along the major surface 202 of the package element. In one embodiment, the conductive planes are used to maintain fixed potentials at locations extending across the package element, to which some of the bond pads 104 of the chip 100 (FIG. 5) are conductively connected through solder bumps 105, and to which some bond pads 106 of the chip may be connected through passive elements 122. One of the conductive planes can be a ground plane, for example, and one of the conductive planes can be maintained at a voltage other than ground.

Referring again to FIGS. 1-4, in embodiment, the microelectronic element 100, instead of being a chip, can be an element of a package to be mounted to a chip, or can be an external element to be mounted to a circuit panel. As above, such component can be referred to as a "package element". By way of example and without limitation, package elements can be articles such as commonly referred to as a chip carrier, e.g., a dielectric sheet or tape having a patterned metal layer. In a particular embodiment, the microelectronic element is a connecting element of a package, e.g., a chip carrier, or other package element or connecting element which conductively connects a chip to another interconnect element such as a circuit panel, as described and shown in commonly owned U.S. patent application Ser. Nos. 10/746,810 filed Dec. 24, 2003; 10/783,314 filed Feb. 20, 2004, or U.S. Pat. No. 6,856,007, all of said applications and said patent being hereby incorporated herein by reference. Alternatively, the microelectronic element can be a substrate having inorganic and/or organic components, e.g., a ceramic substrate. Illustratively, the package element 100 (FIGS. 1-4) is a chip carrier in which the contacts on the side of the chip carrier facing the chip can be arranged in an array having a pitch and placement that coincides with a pitch of the bond pads of a chip.

With reference to FIG. 5, in a particular embodiment, the second microelectronic element 200 can be a circuit panel, being illustratively, an epoxy-resin or FR-4 type circuit board, to which a corresponding package element is mounted, with the passive elements joined in series connections between contacts of the circuit panel and corresponding contacts of the package element.

A method will now be described for fabricating microelectronic assemblies in accordance with the foregoing embodiments. A common feature of the microelectronic assemblies shown in FIGS. 1-4 and 6 is the mounting of passive elements at locations within an array of contacts that are interspersed among high conductivity interconnects that vertically connect one microelectronic element such as a chip to another such as a package element. The passive elements must be mounted to locations in the array of contacts in a way that is compatible with the way that high conductivity interconnects are formed.

In one embodiment, the microelectronic assembly shown in the partial elevational view of FIG. 6 is fabricated as follows. As described above, the microelectronic assembly includes two microelectronic elements, e.g., a chip and a package element, or a package element and another interconnection element, the two microelectronic elements having contacts on surfaces which face each other when the two microelectronic elements are assembled together.

Figure 6A:
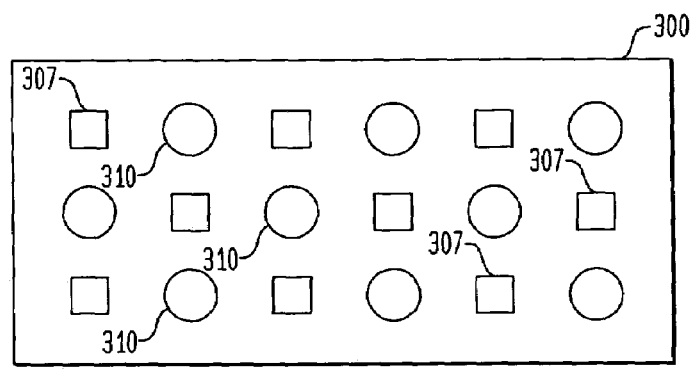
FIG. 6A is a top plan view of a dielectric element utilized in a method of fabricating a microelectronic assembly in accordance with one embodiment of the invention.

A microelectronic element 100 (FIG. 4) is provided which includes a plurality of contacts, e.g., contacts of a package element, conductive terminals of a circuit panel, or bond pads of a chip which are exposed at a major surface of the microelectronic element. Referring to FIG. 6A, passive elements 307 having at least first terminals (e.g., end caps 112; FIG. 4) coated in a solder or other fusible conductive medium are embedded at desired positions in a dielectric element 300, e.g., a tape or interposer element. The passive elements have first terminals on one side of the dielectric material and second terminals on the opposite side of the dielectric material from the first terminals. The dielectric material preferably includes an organic material such as a solder mask, or may include an inorganic material or combination of organic and inorganic materials. In one embodiment, the dielectric element 300 may be constructed of a material which is to remain permanently within the package. In another, dielectric material of the dielectric element is removable by an etchant that otherwise does not harm the exposed major surface of the microelectronic element. The dielectric element 300 has openings 310 sized to accommodate solder balls in places where conductive contacts are to be made. In a particular preferred embodiment, the passive elements are provided in a regular recurring pattern, and the openings for the solder balls are also provided in a regular recurring pattern, to facilitate ease of fabrication and better usability for different microelectronic elements. For example, in a microelectronic assembly, the passive elements and the solder balls can be arrayed in a checkerboard pattern such as that shown and described above with reference to FIGS. 1-4.

The dielectric element 300 carrying the passive elements is aligned to one microelectronic element and is then held together to the microelectronic element. Solder balls can then be provided within the openings of the dielectric element, e.g., as through a process of passing solder balls through a screen aligned to the openings. Heating is then applied to surface mount, i.e., join the solder-coated first terminals at one end of each passive element to the contacts exposed at the surface of the microelectronic element and to melt the solder balls to form solder bumps on other contacts exposed at the surface of the microelectronic element. This forms a microelectronic assembly similar to that shown and described above relative to FIGS. 1-4, except for the presence of the dielectric material disposed between passive elements and the solder balls. In a subsequent stage of fabrication, the one microelectronic element is held together to another microelectronic element such as a chip, and then heated, causing solder-coated second terminals of the passive elements to be joined to the other microelectronic element, and simultaneously melting the solder bumps to also form the assembly. In one embodiment, the dielectric material is preferably one that has low permittivity, i.e., having a low dielectric constant K in order to avoid undesirable parasitic capacitance between interconnects. The dielectric material preferably also has a coefficient of thermal expansion close to that of a chip and/or has a low modulus of elasticity, such as is characteristic of many organic materials. The low modulus of elasticity of organic materials helps the organic material to mitigate the effects of differential strain which occurs between a chip and another microelectronic element such as a chip carrier, due to CTE mismatch.

Alternatively, in a particular embodiment, an etchant is used to remove the dielectric material after initially joining first terminals of the passive elements to the first microelectronic element, or after joining the second, opposite terminals of the passive elements to the other microelectronic element to form the assembly including both microelectronic elements. This can be done, since the dielectric element is no longer needed to hold the passive elements and solder bumps in place.

The foregoing description of a fabrication method is illustrative. The fabrication of microelectronic assemblies in accordance with this invention can be performed by any suitable method. For example, in one method passive elements on which terminals are coated with solder, i.e., "solder-tipped" elements, are first positioned on contacts of one microelectronic element, e.g., a circuit panel, and then joined thereto in a heating step. In such embodiment, solder balls are positioned on another microelectronic element, e.g., an external contact-bearing surface of a package, and then joined to the package by heating to form solder bumps. Thereafter, the circuit panel with the passive elements joined thereto is aligned to the package having the solder bumps and the aligned elements are heated to join the free ends of the bumps and the terminals to the contacts of the corresponding microelectronic elements to form the microelectronic assembly. In a variation of this embodiment, the foregoing technique is applied to fabricate a package having passive elements and solder bumps disposed within the interfacial region between a chip and a package element.

In a further variation of such embodiment, a hierarchical joining method can be used. In such method, the passive elements are first joined to one microelectronic element, using a solder or other fusible conductive medium which has a relatively high attach temperature. Subsequent joining processes are then performed using a solder or fusible conductive medium which has a lower attach temperature than the first solder or fusible conductive medium, such that the conductive medium that holds the first terminals of the passive elements to the first microelectronic element continues to hold the passive elements in place during later joining processes.

Figure 7:
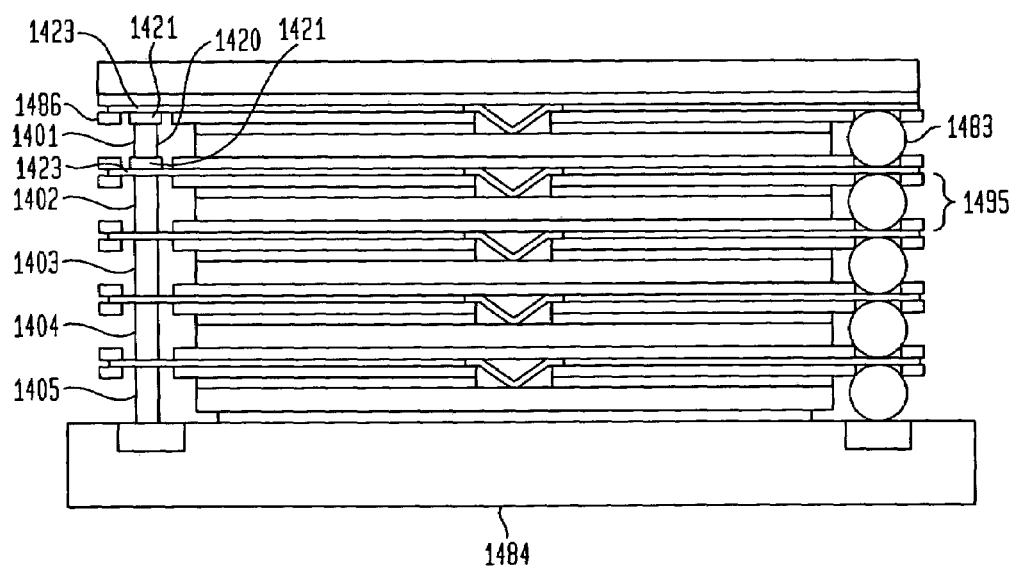
FIG. 7 is a diagrammatic sectional view of a stacked package in accordance with another embodiment of the invention.

Turning now to FIG. 7, another embodiment of the invention is shown. In this illustrative embodiment passive components are used as vertical conductors in place of one, or more, solder balls for coupling units of a stacked assembly together. The stacked assembly of FIG. 7 is similar to the other stacks described above and, e.g., includes a number of circuit panels 1486 arranged in a vertical stack and coupled to each other via conductive elements as represented by solder balls 1483. In addition, the stacked assembly includes one, or more, passive components, coupled between these circuit panels. This is illustratively shown in FIG. 7 by passive components 1401, 1402, 1403, 1404 and 1405. Preferably, each passive component is small enough to span the gap 1495 between adjacent circuit panels. For example, a passive component such as a resistor, capacitor, inductor or the like 1401 may have a small housing 1420 with metallic end caps 1421 at its top and bottom ends. The end caps may be connected to the corresponding terminals 1423 of two adjacent units in the stack by a bonding material such as solder which coats the end caps but which does not bridge between the end caps and hence does not short-circuit the passive element within the housing. In manufacture of such an arrangement, the passive elements may be pre-coated with the bonding material so that they can be applied in manner similar to solder balls. The exterior of housing 1420 may have a polymeric or other surface which is not wettable by the bonding material and hence resists bridging by the bonding material.

Figure 8:
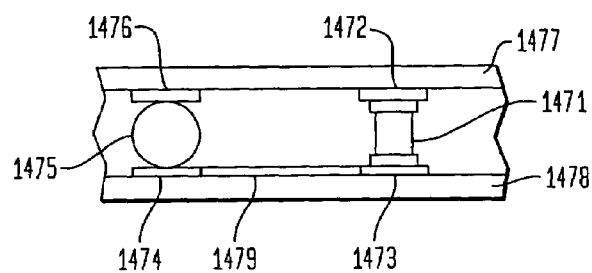
FIG. 8 is a fragmentary diagrammatic sectional view of a stacked package in accordance with another embodiment of the invention.

The passive elements in FIG. 7 are connected in series with one another and hence form one of the vertical buses of the stack. Any number of other variations is possible. In one example (FIG. 8) a passive element 1471 connected may be connected between a first terminal 1472 of a first unit 1477 in the stack and a first terminal 1473 of an adjacent second unit 1478. The first terminal of the second unit in turn may be connected by a trace 1479 on the second unit to a second terminal 1474 of the second unit, which in turn is connected by a solder ball 1475 to a second terminal 1476 of the first unit. In such an arrangement, the passive element, although physically connected between adjacent units, is electrically connected between terminals of the first unit and hence is incorporated in the internal circuitry of the first unit rather than forming part of a vertical bus. In a further variant, solder ball 1475 may be replaced by a further passive element (not shown) so that two passive elements are connected in series in the internal circuit of the first unit 1477.

Figure 9:
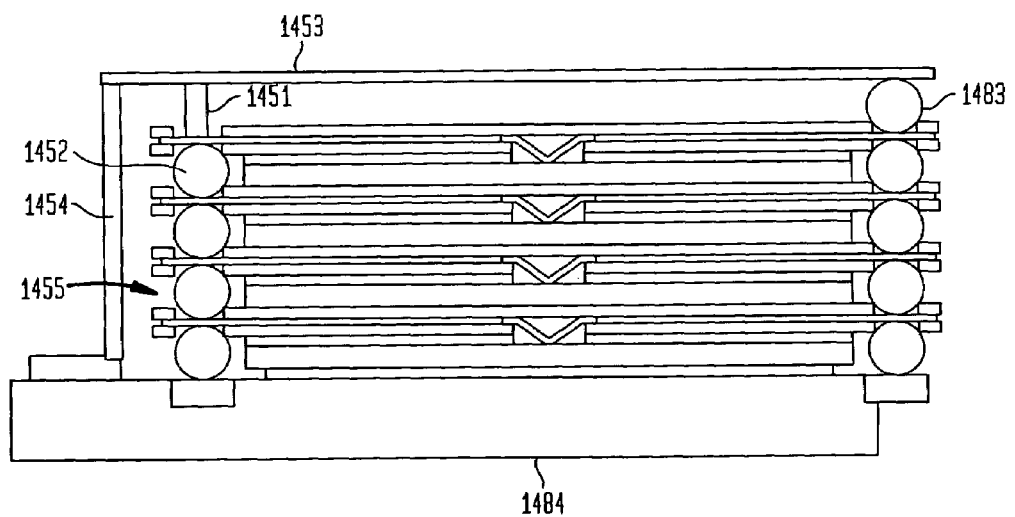
FIG. 9 is an elevational view of a portion of an assembly in accordance another embodiment of the invention.

In a further embodiment (FIG. 9), a passive element 1451 is connected between a signal-carrying terminal 1452 of the topmost operative unit of the stack circuit and a metallic shield 1453 overlying the top of the stack. Shield 1453 has a side wall 1454 extending vertically to the bottom of the stack. When the stack is mounted to a circuit board 1484, the shield is electrically connected to ground. The passive component is thus connected between the top of a vertical signal bus 1455 and a ground potential applied through the shield. In such an arrangement, passive component 1451 serves as a terminating element. For example, passive component 1452 may be a simple resistor to provide a pull-down termination at the top of the signal bus. In the embodiment of FIG. 9, one or more vertical ground buses are connected by conductive elements such as solder balls 1483 to the shield. This arrangement illustrates that the ground or power connections of termination elements to the circuit board can be made by connections other than the vertical buses of the stacked assembly.

As these and other variations and combinations of the features set forth above can be utilized, the foregoing description of the preferred embodiment should be taken by way of illustration rather than by limitation of the invention.

The invention claimed is:

1. A microelectronic assembly, comprising:
   a microelectronic element having a major surface extending in a first lateral direction and in a second lateral direction and having a plurality of surface-mountable contacts arranged in an array exposed at said major surface; and
   a passive element including at least one passive component selected from a resistor, an inductor and a capacitor, said passive element having an inner terminal conductively mounted to an exposed surface of a first one of said contacts and an outer terminal displaced vertically from said major surface, said passive element having a first lateral dimension in said first lateral direction, said first lateral dimension being smaller than a first contact pitch defined as a distance between a center of said first contact and a center of at least a second one of said plurality of contacts immediately adjacent to said first contact in said first lateral direction.

2. The microelectronic assembly as claimed in claim 1, wherein said outer terminal is insulated from said inner terminal.

3. A microelectronic assembly as claimed in claim 2, wherein said inner and outer terminals of said passive element are electrically connected through said passive component.

4. The microelectronic assembly as claimed in claim 1, wherein said passive element has a second lateral dimension smaller than a second contact pitch defined as a distance between a center of said first one of said contacts and a center of at least a third one of said plurality of contacts immediately adjacent to said first contact in said second lateral direction of said array orthogonal to said first lateral direction.

5. The microelectronic assembly as claimed in claim 4, wherein said first and second lateral dimensions are substantially equal.

6. The microelectronic assembly as claimed in claim 1, wherein said passive component includes only a single passive element.

7. The microelectronic assembly as claimed in claim 1, wherein said passive element is mounted to only a single one of said contacts.

8. A microelectronic assembly as claimed in claim 1, wherein said passive element includes a capacitor having a first plate conductively connected to said inner terminal, a second plate conductively connected to said outer terminal, and a capacitor dielectric disposed between said first plate and said second plate.

9. A microelectronic assembly as claimed in claim 1, further comprising metallic end conductors disposed at said inner and outer terminals of said passive element, said end conductors having an exterior surface that is wettable by a fusible conductive medium, said passive element further including an insulator disposed at an exterior surface of said passive element between said end conductors, said insulator having an exterior surface that is nonwettable by said fusible conductive medium to prevent said fusible conductive medium from bridging between said end conductors.

10. A microelectronic assembly as claimed in claim 1, wherein said microelectronic element includes a dielectric element and a metal layer disposed on one side of said microelectronic element, said metal layer including said contacts and further including a plurality of traces extending in a lateral direction along said dielectric element from said contacts.

11. A microelectronic assembly as claimed in claim 1, further comprising a laterally extending conductive plane overlying at least a portion of said microelectronic element, said outer terminal of said passive element being conductively mounted to said conductive plane.

12. A microelectronic assembly, comprising:
    a microelectronic element having a major surface extending in a first lateral direction and in a second lateral direction and having a plurality of surface-mountable contacts arranged in an array exposed at said major surface, said plurality of contacts being arranged in an array on said microelectronic element, said microelectronic element further comprising a plurality of conductive bumps bonded to respective contacts of said array; and
    a plurality of passive elements including at least one passive component selected from a resistor, an inductor and a capacitor, each one of said plurality of passive elements having an inner terminal that is conductively bonded via a fusible conductive medium to a corresponding one of said plurality of contacts and having an outer terminal, said outer terminal of at least some of said plurality of passive elements being displaced vertically from said major surface, a volume of one of said plurality of passive elements being not substantially greater than a volume of one of said plurality of conductive bumps.

13. A microelectronic assembly as claimed in claim 12, wherein said microelectronic element is a semiconductor chip including an integrated circuit disposed therein and said contacts are bond pads exposed at said major surface of said semiconductor chip.

14. A microelectronic assembly as claimed in claim 12, wherein said microelectronic element is a first microelectronic element, said microelectronic assembly further comprising a second microelectronic element, said second microelectronic element having a front surface and contacts exposed at said front surface, wherein at least some of said outer terminals of said passive elements are bonded to said contacts of said second microelectronic element.

15. A microelectronic assembly as claimed in claim 14, further comprising outer conductive bumps, said outer terminals of said passive elements being bonded to said contacts of said second microelectronic element through said outer conductive bumps.

16. A microelectronic assembly, comprising:
    a microelectronic element having a major surface extending in a first lateral direction and in a second lateral direction and having a plurality of surface-mountable contacts arranged in an array exposed at said major surface, said plurality of contacts being arranged in an array on said microelectronic element, said microelectronic element further comprising a plurality of conductive bumps bonded to respective contacts of said array; and
    a plurality of passive elements including at least one passive component selected from a resistor, an inductor and a capacitor, each one of said plurality of passive elements having an inner terminal that is conductively bonded via a fusible conductive medium to a corresponding one of said plurality of contacts and having an outer terminal, said outer terminal of at least some of said plurality of passive elements being displaced vertically from said major surface, a height of one of said plurality of passive elements above said corresponding contact being no greater than a height of one of said plurality of conductive bumps above said corresponding contact.

17. A microelectronic assembly, comprising:

a first microelectronic element having a major surface extending in a first lateral direction and in a second lateral direction and having a plurality of surface-mountable contacts arranged in an array exposed at said major surface, said plurality of contacts being arranged in an array on said first microelectronic element, said first microelectronic element further comprising a plurality of conductive bumps bonded to respective contacts of said array;

a second microelectronic element including a laterally extending first conductive plane overlying at least a portion of said first microelectronic element and being adapted to distribute a ground connection and a second conductive plane extending laterally along said second microelectronic element, said second conductive plane being adapted to distribute a voltage other than ground; and a plurality of passive elements including at least one passive component selected from a resistor, an inductor and a capacitor, each one of said plurality of passive elements having an inner terminal that is conductively bonded via a fusible conductive medium to a corresponding one of said plurality of contacts and having an outer terminal, said outer terminal of at least some of said plurality of passive elements being displaced vertically from said major surface, said at least some of said plurality of passive elements being bonded through its outer terminal to said conductive plane.

* * * * *